United States Patent
Gast

(10) Patent No.: US 8,070,884 B2
(45) Date of Patent: Dec. 6, 2011

(54) METHODS FOR RINSING MICROELECTRONIC SUBSTRATES UTILIZING COOL RINSE FLUID WITHIN A GAS ENVIROMENT INCLUDING A DRYING ENHANCEMENT SUBSTANCE

(75) Inventor: Tracy A. Gast, Waconia, MN (US)

(73) Assignee: FSI International, Inc., Chaska, MN (US)

( * ) Notice: Subject to any disclaimer, the term of this patent is extended or adjusted under 35 U.S.C. 154(b) by 567 days.

(21) Appl. No.: 11/096,935

(22) Filed: Apr. 1, 2005

(65) Prior Publication Data

US 2006/0219258 A1 Oct. 5, 2006

(51) Int. Cl.
*B08B 3/00* (2006.01)
(52) U.S. Cl. ............................................. 134/26; 134/18
(58) Field of Classification Search ................. 134/2, 18, 134/19, 26, 33, 902
See application file for complete search history.

(56) References Cited

U.S. PATENT DOCUMENTS

| | | | |
|---|---|---|---|
| 4,695,327 A | 9/1987 | Grebinski | |
| 4,749,440 A | 6/1988 | Blackwood et al. | |
| 4,781,764 A | 11/1988 | Leenaars | |
| 4,857,142 A | 8/1989 | Syverson | |
| 5,271,774 A * | 12/1993 | Leenaars et al. ................. | 134/31 |
| 5,542,441 A | 8/1996 | Mohindra et al. | |
| 5,571,337 A | 11/1996 | Mohindra et al. | |
| 5,651,379 A | 7/1997 | Mohindra et al. | |
| 5,882,433 A | 3/1999 | Ueno | |
| 5,896,875 A | 4/1999 | Yoneda | |
| 5,921,257 A | 7/1999 | Weber et al. | |
| 6,012,472 A | 1/2000 | Leenaars et al. | |

(Continued)

FOREIGN PATENT DOCUMENTS

JP 410256221 A 9/1998
(Continued)

OTHER PUBLICATIONS

"Excalibur 2000 Vapor HF Etching System," FSI International, Inc., Data Sheet, 2 pages, 2000.

(Continued)

*Primary Examiner* — Michael Kornakov
*Assistant Examiner* — Eric Golightly
(74) *Attorney, Agent, or Firm* — Kagan Binder, PLLC

(57) ABSTRACT

Rinsing and drying a surface of a microelectronic device and the enhanced removal of rinse fluid from the surface of the microelectronic device while the microelectronic device is rotated is provided as part of a spray processing operation. Rinse fluid is generally directed to the surface of the microelectronic device by a dispensing device while one or more such microelectronic devices are supported on a turntable in a generally horizontal fashion. Drying gas is supplied after the rinsing step. During at least a portion of both rinsing and drying steps, a drying enhancement substance, such as IPA, is delivered to enhance the rinsing and drying. Particle counts and evaporation thicknesses are reduced by delivering a tensioactive compound like IPA, during at least portions of the rinsing and drying steps while a microelectronic device is controllably rotated. The tensioactive compound is preferably delivered into the processing chamber during rinsing and drying and rinse fluid, preferably DI water, is preferably dispensed to the microelectronic device surface at a temperature below the dew point of the tensioactive compound. Moreover, the rotational speeds of the microelectronic device during drying and the tensioactive compound delivery concentration, timing and duration are preferably optimized to achieve further reduced particle counts and evaporation thicknesses.

18 Claims, 6 Drawing Sheets

U.S. PATENT DOCUMENTS

| | | | |
|---|---|---|---|
| 6,139,645 A | 10/2000 | Leenaars et al. | |
| 6,170,495 B1 | 1/2001 | Leenaars et al. | |
| 6,199,298 B1 | 3/2001 | Bergman | |
| 6,221,781 B1 | 4/2001 | Siefering et al. | |
| 6,240,938 B1 | 6/2001 | Oshinowo | |
| 6,247,481 B1 | 6/2001 | Meuris et al. | |
| 6,261,377 B1 | 7/2001 | Mertens et al. | |
| 6,264,036 B1 | 7/2001 | Mimken et al. | |
| 6,312,597 B1 | 11/2001 | Mohindra et al. | |
| 6,328,809 B1 | 12/2001 | Elsawy et al. | |
| 6,334,902 B1 | 1/2002 | Mertens et al. | |
| 6,354,311 B1 | 3/2002 | Kimura et al. | |
| 6,401,732 B2 | 6/2002 | Bergman | |
| 6,530,385 B2 | 3/2003 | Meuris et al. | |
| 6,533,872 B1 | 3/2003 | Leenaars et al. | |
| 6,551,409 B1 | 4/2003 | DeGendt et al. | |
| 6,568,408 B2 * | 5/2003 | Mertens et al. | 134/95.2 |
| 6,592,676 B1 | 7/2003 | Mertens et al. | |
| 6,632,751 B2 | 10/2003 | Mertens et al. | |
| 6,676,765 B2 | 1/2004 | Mertens et al. | |
| 6,754,980 B2 | 6/2004 | Lauerhaas et al. | |
| 6,875,289 B2 | 4/2005 | Christenson et al. | |
| 2001/0000575 A1 | 5/2001 | Meuris et al. | |
| 2001/0022186 A1 | 9/2001 | Mertens et al. | |
| 2001/0053585 A1 | 12/2001 | Kikuchi et al. | |
| 2001/0055857 A1 | 12/2001 | Meuris et al. | |
| 2002/0011257 A1 | 1/2002 | Degendt et al. | |
| 2002/0016082 A1 | 2/2002 | Mertens et al. | |
| 2002/0125212 A1 | 9/2002 | Mertens et al. | |
| 2002/0148483 A1 | 10/2002 | Mertens et al. | |
| 2002/0170573 A1 * | 11/2002 | Christenson et al. | 134/2 |
| 2002/0185152 A1 | 12/2002 | Lauerhaas et al. | |
| 2002/0185154 A1 | 12/2002 | Hosack et al. | |
| 2003/0145878 A1 | 8/2003 | Meuris et al. | |
| 2003/0192577 A1 | 10/2003 | Thakur et al. | |
| 2004/0010933 A1 | 1/2004 | Mertens et al. | |
| 2004/0045589 A1 | 3/2004 | Holsteyns et al. | |
| 2004/0194801 A1 | 10/2004 | Verhaverbeke | |
| 2005/0000549 A1 * | 1/2005 | Oikari et al. | 134/25.4 |
| 2006/0070638 A1 * | 4/2006 | Aegerter et al. | 134/26 |

FOREIGN PATENT DOCUMENTS

| | | |
|---|---|---|
| JP | 11087305 | 3/1999 |

OTHER PUBLICATIONS

"Ultraclean Marangoni Drying," J. Marra, Particles in Gases and Liquids 3: Detection, Characterization and Control, K.I. Mittal, ed., Plenum Press, New York, pp. 269-282, 1993.

"Novel Drying Concepts for Single-Wafer Wet Cleaning," IMEC Newsletter No. 27, pp. 1-2, Jul. 2000.

* cited by examiner

| Rinse Water Temperature (C) | IPA Duration | IPA Concentration (Percent) | Dry RPM | Contaminants ≥ 65 nanometers | | |
|---|---|---|---|---|---|---|
| | | | | Pre | Post | Delta |
| 21 | N/A | N/A | 500 | 844 | 5937 | +5093 |
| 21 | Dry Only | 3% | 500 | 476 | 597 | +103 |
| 21 | Rinse and Dry | 3% | 500 | 34 | 515 | +481 |
| 21 | N/A | N/A | 3000 | 1273 | 7852 | +6579 |
| 21 | Dry Only | 1% | 3000 | 48 | 2231 | +2183 |
| 21 | Rinse and Dry | 1% | 3000 | 41 | 1059 | +1018 |
| 21 | Dry Only | 2% | 3000 | 323 | 539 | +216 |
| 21 | Rinse and Dry | 2% | 3000 | 86 | 214 | +128 |
| 21 | Dry Only | 3% | 3000 | 42 | 148 | +106 |
| 21 | Rinse and Dry | 3% | 3000 | 67 | 169 | +102 |
| 15 | Rinse and Dry | 3% | 3000 | 40 | 146 | +106 |
| 10 | Dry Only | 3% | 3000 | 236 | 247 | +11 |
| 10 | Rinse and Dry | 3% | 3000 | 88 | 123 | +35 |
| 10 | Dry Only | 3% | 500 | 314 | 289 | -25 |
| 10 | Rinse and Dry | 3% | 500 | 188 | 113 | -75 |

Fig. 5

| Dry Type | Dry Speed (RPM) | IPA Concentration | Rinse Temperature | Evaporated Thickness (Microns) |
|---|---|---|---|---|
| Rotational | 3000 | N/A | 21C | 1.09 |
| Rotational W/IPA Rinse and Dry | 3000 | 3% | 21C | 0.42 |
| Rotational W/IPA Dry Cycle Only | 3000 | 3% | 21C | 0.35 |
| Rotational WO/IPA Rinse and Dry | 3000 | N/A | 10C | 1.17 |
| Rotational W/IPA Rinse and Dry | 3000 | 3% | 10C | 0.23 |
| Rotational W/IPA Dry Cycle Only | 3000 | 3% | 10C | 0.29 |
| Bath/Marangoni | 1mm/sec | 0.5% | 21C | 0.34 |
| Bath No IPA | 1mm/sec | N/A | 21C | 1.4 |

Fig. 6

METHODS FOR RINSING MICROELECTRONIC SUBSTRATES UTILIZING COOL RINSE FLUID WITHIN A GAS ENVIROMENT INCLUDING A DRYING ENHANCEMENT SUBSTANCE

TECHNICAL FIELD

The present invention is directed to the rinsing of a surface of a substrate and the enhanced drying or removal of rinse fluid from the surface of the substrate while the substrate is rotated. In particular, the present invention is directed to the optimization of the dispensing of rinse fluid and a drying enhancement substance, such as isopropyl alcohol, for better removal of the rinse fluid during substrate rotation and for reducing final contaminant count levels especially applicable to bare hydrophobic substrates.

BACKGROUND OF THE INVENTION

In the processing of microelectronic devices, such as those including semiconductor wafers and other microelectronic devices at any of various stages of processing, substrate surface cleanliness is becoming more and more critical in virtually all processing aspects. Surface cleanliness is measured in many ways and looks at particle presence and/or water marks as contaminants that may affect production of a microelectronic device.

Microelectronic devices include, as examples, semiconductor wafers at any stage of processing and devices such as flat panel displays, micro-electrical-mechanical-systems (MEMS), advanced electrical interconnect systems, optical components and devices, components of mass data storage devices (disk drives), and the like. In general, reduction in the quantity of smaller and smaller particles from such substrate surfaces is desired in order to maximize productivity of devices from semiconductor wafers and to meet quality standards as determined for such devices while doing so with effective and efficient processing steps. Whereas substrate features and surface characteristics, like a hydrophobic or hydrophilic nature of surfaces, affect the rinsing and particle reduction effectiveness, obtaining acceptable substrates of one type does not necessarily predict effectiveness on another. In particular, bare hydrophobic substrates have been found to be increasingly difficult to effectively reduce the presence of smaller and smaller particles because it is difficult to rinse and dry such substrates without adding significant particles.

Substrate surface cleanliness is important at all processing stages after the application of any processing, cleaning or rinsing fluid to a substrate surface, such as by spray dispensing or immersion techniques. After any rinse step, and in particular, after a final rinse step, it is of greater criticality to provide a clean substrate surface with process, cleaning and rinsing fluids and particles effectively removed as determined for any such microelectronic processing. The effectiveness of cleaning a surface with respect to the presence of particle contaminants is typically determined by the ability to measure particles of a predetermined size and greater as are present on the substrate surface after rinsing and drying, for example. As noted above, the trend in the industry is to reduce the presence of smaller and smaller particles from microelectronic devices for greater productivity and device efficiencies. Many techniques have been developed and accepted for effectively determining the quantity of particles on a microelectronic device surface. The effectiveness of cleaning a surface may also be determined with respect to the presence of liquid films and water marks by measuring liquid thicknesses on the surface after rinsing and drying. Techniques for measuring such film thicknesses have also been developed.

Representative steps in wet processing of microelectronic devices include microelectronic device etching, rinsing and drying. As used herein, wet processing includes immersion processing where at least a portion of a microelectronic device is subjected to immersion for a desired period of time and spray processing where process fluids (including rinse fluid) are dispensed to a device surface. Microelectronic device processing typically includes a series of discrete steps such as including a cleaning and/or wet etching step followed by rinsing and drying. These steps may involve the application of a suitable treatment chemical to the substrate surface, e.g., a gaseous or liquid cleaning solution or an etching or oxidizing agent. Such cleaning solutions or etching or oxidizing agents are then preferably removed by a subsequent rinsing step that utilizes a rinsing fluid such as deionized water (DI water) to dilute and ultimately wash away the previously-applied substances. The removal of native oxides on silicon surfaces by sufficient etching typically changes the silicon surface from hydrophilic and renders such HF last-etched surfaces as hydrophobic.

In the case of immersion processing, lifting one or more substrates from a rinse bath (such as a cascade type rinser, as are well known) or lowering the liquid within the vessel can be conducted after the device(s) are adequately rinsed in order to separate the device(s) from the rinse liquid. For spray processing, rinse fluid is dispensed onto a device surface for a determined period while and/or after which a device (or plurality of devices on a carousel in a stack) is rotated or spun at an effective speed to sling the rinse fluid from the device surface. In either immersion or spray processing, it is a goal of such rinsing processes to effectively dry a processed device, i.e. to physically remove as much rinse fluid as possible, in order to reduce the amount of fluid that is left after rinsing to be evaporated from the device surface. Evaporation of rinse fluid may leave behind any contaminants or particles that had been suspended within the fluid.

For enhanced separation or removal of rinse fluid from microelectronic devices after a rinsing step, techniques have been developed to introduce certain compounds that create a surface tension gradient within the rinse fluid at and near the point of separation of the fluid from the device surface. The effect of this, commonly called the Marangoni effect, is to enhance the ability of the rinse fluid (typically DI water) to shed from the device surface under the action of either separating a device from a liquid bath in immersion separation or spinning a device in the case of spray dispensing. The removal of rinse fluid has been found to be enhanced on either hydrophilic or hydrophobic device surfaces with such techniques. Compounds that affect surface tension and create such a surface tension gradient are known and include isopropyl alcohol (IPA), 1-methoxy-2-propanol, di-acetone alcohol, and ethyleneglycol and are hereinafter referred to as tensioactive compounds. See for example, U.S. Pat. No. 5,571,337 to Mohindra et al. for an immersion type vessel and U.S. Pat. No. 5,271,774 to Leenaars et al. for a spin dispensing apparatus, each of which utilize the Marangoni effect as part of the removal of rinse fluid.

After rinsing, a thin film of rinse fluid may remain on some or all of a microelectronic device surface (particularly with a hydrophilic surface) and/or liquid drops may remain at certain points, such as are known to sometimes form at edge gripper contact points. Any such remaining fluid is desirably removed with a further drying step. The rinsing and drying steps are, in general, separate processing events. Drying does not typically begin until the substrate surface has been rinsed as completely as possible of contaminants and processing chemicals. A particular drying operation utilized depends on parameters of the separation or removal (e.g. speed of separation or spinning, orientation of the microelectronic devices, and the like) as well as characteristics of the microelectronic devices themselves (e.g. the hydrophilic or hydrophobic nature of the device surface, the presence of patterning or not on the device surface). Any liquid droplets or films that remain on a microelectronic device surface after rinsing and separation are desirably removed from the microelectronic device surface. If such droplets or films are left to evaporate from the microelectronic device surface, any contaminants suspended within the droplets or films might be deposited on the microelectronic device surface, which contaminants may render a portion of the microelectronic device unsuitable for further processing or use. Known drying techniques include the use of heated gases, such as heated nitrogen gas, after the rinsing step for removing unwanted droplets and films from the microelectronic device surfaces.

One important aspect in providing clean microelectronic devices after wet processing is to start with the use of clean processing liquids. Clean liquid use can be controlled by known or developed filtering processes so as to minimize introduction of contaminants into the processing environment. This is particularly true where devices are being cleaned or rinsed by a wet process, such as by using DI water as a rinse liquid. Specific filtering techniques for ultra-clean DI water have been developed for use in the microelectronic industry, such as those described in U.S. Pat. Nos. 5,542,441, 5,651,379 and 6,312,597 to Mohindra et al.

Microelectronic devices are often rinsed as a batch within an immersion vessel (such as maintained in a spaced orientation by a cassette or holder) or within a spray processor (such as provided on a carousel). More recently, there has been greater interest in the development of single wafer wet processing. For immersion single wafer processing, smaller single wafer vessels have been developed as described in copending U.S. patent application Ser. No. 10/243,616 to Christenson et al. Spray processing, however, fits well with the concept of single wafer processing because of the orientation of such microelectronic devices in a horizontal fashion and the easier loading and unloading of such devices as provided to and from other processing stations. Also, there is a greater potential for quicker throughput of single devices with spray processing.

However, due to the horizontal nature of the treated surface of the microelectronic device as may be processed within a spray processor, it is more difficult to obtain a clean removal of processing fluids and reduction in contaminants from the device surface. Thus, even after a rinse step, unacceptable levels of contaminants or particles can be present for a particular application especially as device features become smaller. With hydrophobic surfaces, such as result from an HF last-etched silicon surface, small particle count reduction is found to be most difficult. An important aspect in particle count reduction is to rinse and dry a device while minimizing particles left behind.

An attempt to obtain substrates with better removal of processing fluids from horizontally rotated substrates is described in U.S. Pat. No. 6,568,408 to Mertens et al. Described are methods and equipment that controllably create a sharply defined liquid-vapor boundary, which boundary is moved across the substrate surface along with moving liquid and vapor delivery nozzles. As described in the Mertens et al patent, a surface tension gradient is theoretically created within such boundary by the specific delivery of the vapor to the boundary as such is miscible within the liquid for enhancing liquid removal based upon the Marangoni effect. Such a system may be more effective on hydrophilic surfaces, but adds significantly to the complexity of the system and the manner of control needed to obtain rinsing with adequate rinse fluid removal. The effectiveness of such a system is significantly less for completely hydrophobic surfaces, such as HF last-etched silicon wafers, where a reduction in contaminants, such as small particles, is still desired.

The Leenaars et al U.S. Pat. No. 5,271,774, noted above, describes an apparatus and methods for delivering organic solvent vapor to a substrate surface after it is rinsed and leaves a water film layer on the substrate surface (as such naturally forms on a hydrophilic wafer surface) followed by rotation. Organic solvent vapor is introduced into a process chamber, preferably unsaturated, as controlled by the vapor temperature. FIGS. 2, 3 and 5 show the sequence of starting with a rinse water film on a substrate surface followed by the film's breaking up into thicker drops as a result of exposure to the organic solvent vapor. Then, the drops are more easily slung from the surface by rotation. Whereas the action of the organic solvent vapor is to create drops from a film of water as such a film layer is possibly provided on a hydrophilic surface, such action would not be required in the situation where a hydrophobic surface is rinsed with water since the same effect is naturally created. For a hydrophobic surface, the rinse water beads into drops on the device surface due to the nature of the surface. Again, there is a need to improve the reduction of contaminants on all surfaces, but in particular, for hydrophobic device surfaces.

SUMMARY OF THE INVENTION

The present invention overcomes the shortcomings of the prior art by providing systems and methods having improved processing steps in order to optimize the rinsing and drying of microelectronic devices within a spray processing chamber while such a microelectronic device is rotated.

In accordance with the present invention, the presence of light point defects, such as small particles and water mark are reduced after a rinsing and drying operation within a spin type spray processing chamber and the thickness of rinse fluid as a film on a surface of a microelectronic device can be reduced to minimize evaporation of rinse fluid from the microelectronic device surface. A reduction in the presence of small particles is achieved even for hydrophobic surfaces, such as HF last-etched silicon wafers, by the controlled delivery of drying enhancement substance and rinse fluid.

Particle counts and evaporation thicknesses are reduced by delivering a drying enhancement substance, preferably a tensioactive compound like IPA, during at least a final portion of a rinsing step and thereafter during a drying step after the rinse fluid dispense is terminated. During both the rinsing and drying steps, the microelectronic device is preferably controllably rotated. In accordance with one aspect of the present invention, the tensioactive compound is delivered into the processing chamber during rinsing and drying at a given concentration below a saturation point within a gas environment of the processing chamber and having an associated dew point temperature within the processing chamber, and rinse fluid, preferably DI water, is dispensed to the microelectronic device surface at a temperature below the dew point of the tensioactive compound within the chamber for cooling the device surface and causing a localized condensation of the tensioactive compound to the device surface. Moreover, the rotational speeds of the microelectronic device during drying and the tensioactive compound delivery concentration, timing and duration are preferably optimized to achieve further reduced particle counts and evaporation thicknesses.

BRIEF DESCRIPTION OF THE DRAWINGS

FIG. 5 is a table illustrating pre and post rinsing and drying particle count data obtained by experiments conducted on hydrophobic silicon wafers with varied concentrations of IPA, rotational speeds, IPA delivery duration, and temperature of DI water as a rinse fluid; and FIG. 6 is a table illustrating evaporated thickness measurements of rinse water data obtained by experiments conducted on hydrophilic silicon wafers with varied concentrations of IPA, rotational speeds, rinse water temperatures, and IPA delivery durations, and also shows similar data obtained relating to comparative processes of rinsing and drying silicon wafers of a similar nature.

DETAILED DESCRIPTION

Figure 1:
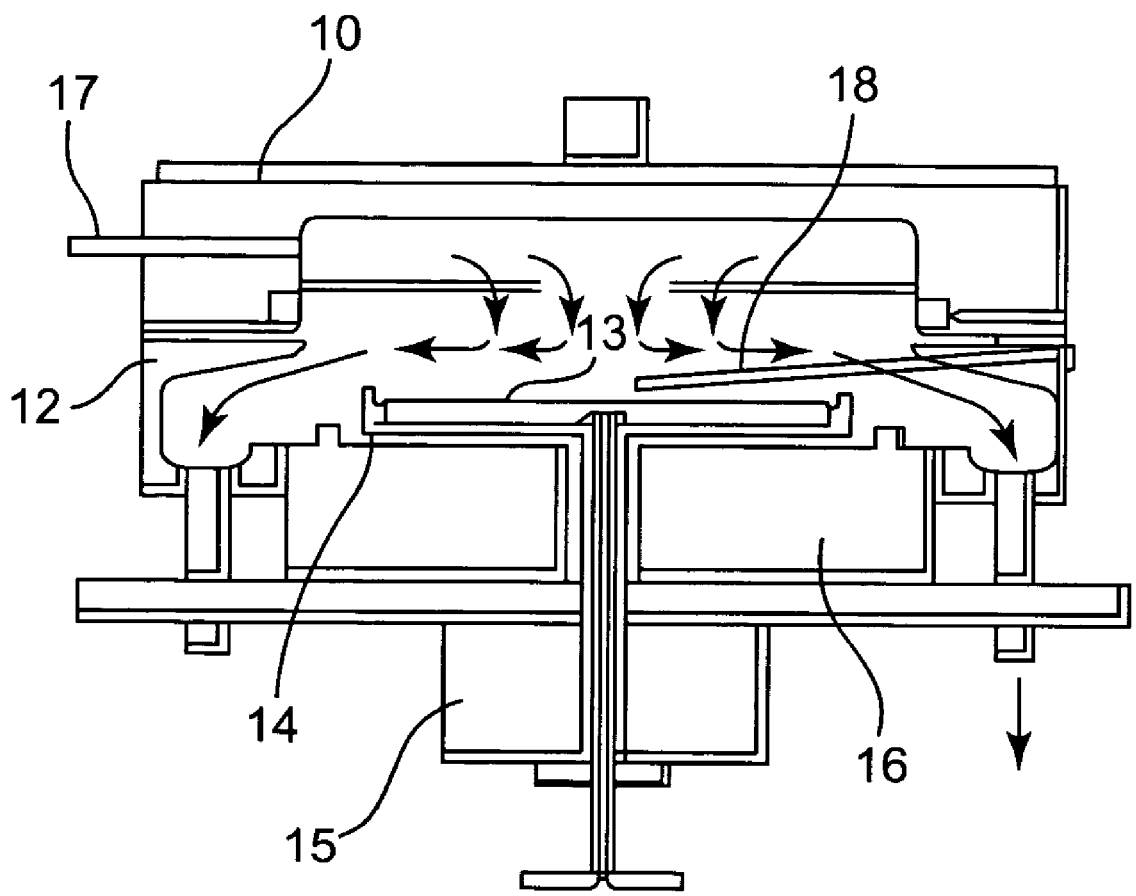
FIG. 1 is schematic side view of a processing chamber within which a microelectronic device can be processed including the ability to rotationally support a microelectronic device for subsequent rising and drying in accordance with an aspect of the present invention, which can be utilized within a system such as shown in FIG. 2.

The present invention is directed to the rinsing of a surface of a microelectronic device and the enhanced drying or removal of rinse fluid from the surface of the microelectronic device while the microelectronic device is rotated as part of a spray processing operation. In accordance with an aspect of the present invention, wet microelectronic device surfaces can be dried while reducing contaminants such as particles and water marks as may be left by the removal of the rinse fluid. Rinse fluid is generally directed to the surface of the microelectronic device by a dispensing device while one or more such microelectronic devices are supported on a turntable in a generally horizontal fashion. A plurality of microelectronic devices may be supported on a single turntable surface or on multiple surfaces arranged in a stack, for example, or a single microelectronic device, such as a circular wafer, for example, can be supported on a turntable to rotate about its center or otherwise. A turntable is preferably operatively provided within a processing chamber, as described in greater detail below, which processing chamber may be utilized only for the rinsing and drying process or for rinsing and drying following another processing step, such as an etching operation as are themselves well known. Appropriate ingress and egress is also preferably provided to and from the processing chamber and to maintain the processing chamber as a clean environment based upon any particular application. Furthermore in accordance with the present invention, the rinsing of a surface of a microelectronic device is preferably enhanced by dispensing a drying enhancement substance during at least some portion of the rinse fluid dispense for better separation of the rinse fluid from the microelectronic device surface. In particular, the present invention is directed to the optimization of the dispensing of rinse fluid and the drying enhancement substance, such as any tensioactive compound, for improved contamination control and particle reduction with the removal of the rinse fluid during substrate rotation. The remaining description of the present invention will be directed to the rinsing and drying of a single microelectronic device, optionally with other processing steps, as operatively supported to rotate within a processing chamber with the understanding that the operation techniques and steps can just as easily be applied to multiple microelectronic devices supported in any way to be rotatable together or independently.

The rinse fluid can comprise any fluid that can be dispensed to the microelectronic device surface and that effectively rinses a device surface to reduce contaminants and/or prior applied processing liquid or gas. Preferably, the rinse fluid comprises DI water (deionized water) that is directed to the microelectronic device surface while the microelectronic device is rotated within a processing chamber, although it is contemplated that the rinse fluid may itself also comprise a processing fluid having other or additional processing functionality. Preferably, the microelectronic device is rotated while it is oriented in a substantially horizontal manner so that the rinse fluid can be controlled to rinse the desired surface of the microelectronic device effectively for a determined time period, although it is contemplated that the microelectronic device can be otherwise supported at an angle tilted from horizontal. Rinse fluid can be dispensed to the center area of a rotating microelectronic device or toward one edge or another thereof or anywhere in-between with it being preferable that a rinse operation effectively rinse the desired surface of the microelectronic device for a determined time period to achieve a clean device in accordance with predetermined conditions.

After the rinsing step, the microelectronic device is preferably also subjected to a drying step, which drying step comprises at least a continuation of the rotation of the microelectronic device after the rinse fluid dispense is terminated for a determined time period to sling rinse fluid from the device surface. Delivery of drying gas, such as nitrogen that may or may not be heated, is also preferred during a drying step. The drying step is preferably continued for as long as necessary to render the microelectronic device surface sufficiently dry to achieve satisfactory product at desired final contamination levels based upon any particular application. With hydrophilic surfaces, a measurable thin liquid film may still be present on some or all of a device surface. The drying step may be performed with the microelectronic device rotated at the same or at different revolutions per minute as the rinsing step.

The rinsing and drying steps are, in general, separate processing events. Drying should typically not begin until the substrate surface has been rinsed as completely as possible of contaminants and processing or reaction compounds. The need for a particular drying operation depends on parameters of the separation or rinsing step (e.g. speed of separation or spinning, orientation of the microelectronic devices, and the like) as well as characteristics of the microelectronic devices themselves (e.g. the hydrophilic or hydrophobic nature of the device surface). For example, HF last-etched silicon wafer surfaces that are etched sufficiently to substantially remove the native oxides are hydrophobic in nature. Where oxide remains after etching, the surfaces may be still be hydrophilic or mostly hydrophilic in nature. Hydrophilic substrates, on the other hand, have a greater tendency to create water marks after rinsing and drying even with reduced particle counts. Any remaining liquid on a microelectronic device surface after the rinsing step are desirably removed from the microelectronic device surface during the drying step. If such liquid is left to evaporate from the microelectronic device surface, any contaminants within the liquid can be deposited on the microelectronic device surface, which contaminants may render a portion of the microelectronic device unsuitable for further processing or use. Undesirable water marks may also result from rinse liquid evaporation. Any additional known or developed drying techniques can be utilized as part of the drying step or as a subsequent drying step, with it being preferable to use clean heated gas(es), such as heated nitrogen gas, for removing unwanted liquid from the microelectronic device surfaces while the device is rotated.

The present invention is, in particular, based upon the optimization of one or more of the many parameters of the rinsing and drying process steps as part of a spray processing operation to obtain improved rinsing and drying of microelectronic device surfaces as determined by the attainment of desired contaminant levels including the minimization of water marks and reduction of particle counts as measured by the presence of certain particles of a selected size or greater on a microelectronic device surface after the rinsing step. As above, it is also understood that the rinsing operation may and typically does increase the presence of measurable particles on a microelectronic device surface, such as after a gas etching step that leaves a microelectronic device surface cleaner from particles but with undesirable residual processing and/or reaction compounds. Contaminants such as particles, water marks and crystal defects on a device surface are sometimes characterized as "light point defects" based upon their ability to be sensed, although crystal defects are not affected by a rinse/dry operation.

Operational parameters of rinsing and drying steps that can be optimized alone or based upon the combination effects thereof include rinse fluid composition, temperature and flow rates, drying gas composition, temperature and flow rates, the composition, temperature, flow rates and concentration of tensioactive compound used as a drying enhancement substance, the use (or not) of a carrier gas with the drying enhancement substance and the carrier gas's properties including its composition, temperature and flow rate, the timing duration and sequences of delivery of the rinse fluid, drying gas and drying enhancement substance (with or without a carrier gas), and the rotational speed (in revolutions per minute, "rpm") of the microelectronic device during the rinsing and drying steps as such may be varied within each step. In particular, the present invention recognizes the synergistic effect of optimizing the rinse fluid temperature with the concentration of drying enhancement substance and the rotational speed of the microelectronic devices in achieving a reduction in light point defects on rinsed and dried microelectronic devices. Importantly also, the present invention achieves improved contaminant reduction results on microelectronic devices by the utilization of colder rinse fluid in a spray processing system than the temperatures of rinse fluid that have been used to rinse such microelectronic devices by methods of the prior art. As described in greater detail below and exemplified in the included data, rinse fluid temperatures (preferably of DI water) below fifteen degrees centigrade (15° C.) provide unexpectedly improved results even under a wide variety of concentrations of drying enhancement substance (preferably isopropyl alcohol, "IPA") and rotational speeds of the microelectronic devices. However, as discussed in greater detail below, an IPA concentration is preferably provided in the processing environment to have an associated dew point that is above the rinse fluid temperature so that IPA will locally condense from the gas environment onto the microelectronic device surface and/or the rinse fluid on the device surface, which device surface is cooled by the rinse fluid. In other words, the IPA does not condense by controlling the IPA concentration and temperature of the whole IPA/gas environment within the processing chamber, but by cooling the device surface with the rinse fluid to cause a local cooling of the IPA/gas environment adjacent to the device surface. The condensation of IPA onto the device surface and/or the rinse fluid on the device surface enhances rinse fluid removal under the action of device rotation and reduces the presence of contaminants such as water marks and particles on both hydrophilic and hydrophobic device surfaces.

Such processing steps including the optimization of the many parameters can be conducted on any spray processing apparatus including an ability to rotate one or more microelectronic device(s) within a processing chamber. To that end, a processing chamber within which a microelectronic device can be rotationally supported for subsequent rising and drying in accordance with an aspect of the present invention is schematically illustrated in FIG. 1. As shown, the processing chamber is configurable between an etch position and a rinse position with an intermediate transfer position. The processing chamber comprises a chamber bell 10 and a lower chamber assembly 12. A wafer 13, as a particular microelectronic device for example, is supported on a rotatable chuck 14 that is driven by a spin motor 15. The lower chamber assembly 12 is also relatively movable with respect to a pedestal 16 that supports the chuck 14 so that the chuck 14 can rotate relative to the pedestal 16. A gas inlet line 17 permits the introduction of gas into the internal cavity of the system chamber, which gas inlet line 17 can be used to deliver etching gas, drying enhancement substance in the form of a gas with or without carrier gas, and drying gas as appropriate for any one or more particular processing step as noted above. Any plurality of such gas inlet lines can be provided for delivering such gases independently, and any such gas inlet line may further include any kind of nozzle or other dispensing element for controlled dispensing and application to the wafer 13 or otherwise within the processing chamber. If a liquid is to be dispensed instead of a gas for any of these purposes, appropriate liquid handling lines, nozzles and the like are contemplated. Also illustrated is a liquid inlet conduit 18 that facilitates the dispensing of rinse fluid onto the wafer surface, such as after etching. The dispensed rinse fluid can collect in the rinse bowl section of the internal chamber so as to exit from the internal chamber though appropriate drains.

The configurability of such a processing chamber between etch, transfer and rinse positions is based upon two different relative movements. The first movement is the relative movement between the chamber bell 10 and the lower chamber assembly 12. The second movement is the relative movement between the pedestal 16 and the lower chamber assembly 12. In the illustrated system, the chamber bell 10 moves with the lower chamber assembly 12 during this second movement.

For operation, a wafer 13 is loaded onto the rotatable chuck 14 while in the transfer position, which is defined as where the chamber bell 10 is raised and separated from the lower chamber assembly 12. This loading can be conducted by a known robotic system that can move a wafer in and out of the process chamber and set it down on the chuck 14 (i.e. a robot with three axis movement). In this position, gas, such as nitrogen, can be introduced though the gas inlet line 17 for purging the processing chamber and to maintain a clean gas environment near the wafer 13. Then, for etching, the chamber bell 10 can be lowered back to a position against the lower chamber assembly 12. Between them, a fluoropolymeric o-ring is preferably provided to generate a seal between the chamber bell 10 and the lower chamber assembly 12. In particular, a driver, such a pneumatic pancake cylinder, provides a first motion system that moves the chamber bell 10 against the lower chamber assembly 12 so as to provide a sufficient crush force to create a efficient seal. Also, a configuration for etching preferably includes a relative movement of the chamber bell 10 and lower chamber assembly 12 relative to the chuck 14 and pedestal 16 from the configuration of FIG. 1 so that chamber bell 10 is lowered closer to the wafer 13 as positioned on the chuck 14. Any conventional drive device such as a pneumatic cylinder can also be used for this second movement. Then, etchant gas can be introduced though the gas inlet line 17 to perform the etching operation in accordance with known vapor phase etching process techniques. Note also that in the etch position the rinse bowl section of the internal chamber is substantially closed from the etching portion of the internal chamber by way of the interaction of pedestal 16 and the lower chamber assembly 12. Thus, the etching portion of the internal chamber is substantially isolated during the etching operation from the rinse bowl section where droplets of rinsing fluid may still be present on the rinse bowl surfaces from a prior rinsing operation. The desire to isolate the etching and rinse bowl sections from one another depends on the etchant used, machine thoughput requirements, and wafer application process tolerances. After etching, the rinse operation is conducted by raising the chamber assembly (comprising the chamber bell 10 and the lower chamber assembly 12) while leaving the wafer chuck 14 at the same elevation, thus effectively lowering the wafer 13 to a rinse position within the rinse bowl section of the internal chamber as illustrated in FIG. 1. Thus, rinse fluid, such as DI water, can be dispensed onto the wafer 13 via the liquid inlet conduit 18, and the rinse fluid can leave the internal process chamber though its rinse bowl section that leads to drains. By positioning the wafer in the rinse position, the rinse fluid can be dispensed on the wafer 13 with minimal exposure of the rinse fluid to the internal walls of the etching portion of the internal process chamber. Preferably, clean gas including a drying enhancement substance, such as IPA, is also provided though the gas inlet line 17 during some or all of the rinsing operation for not only purging gas etchant from the internal chamber, but also to deliver drying enhancement substance into the processing chamber and to ultimately locally condense on the wafer surface in accordance with the present invention. Once the rinse and dry operation is complete, the lower chamber assembly 12 can be lowered relative to the pedestal 16 so as to position the wafer 13, once again, in the transfer position, where it is again accessible by the system robot. The lower chamber assembly 12 may be lowered with the chamber bell 10 followed by the chamber bell 10 being subsequently raised to the transfer position. Or the lower chamber assembly 12 may be lowered while the chamber bell 10 is maintained in an up position so as to create the transfer position.

Figure 2:
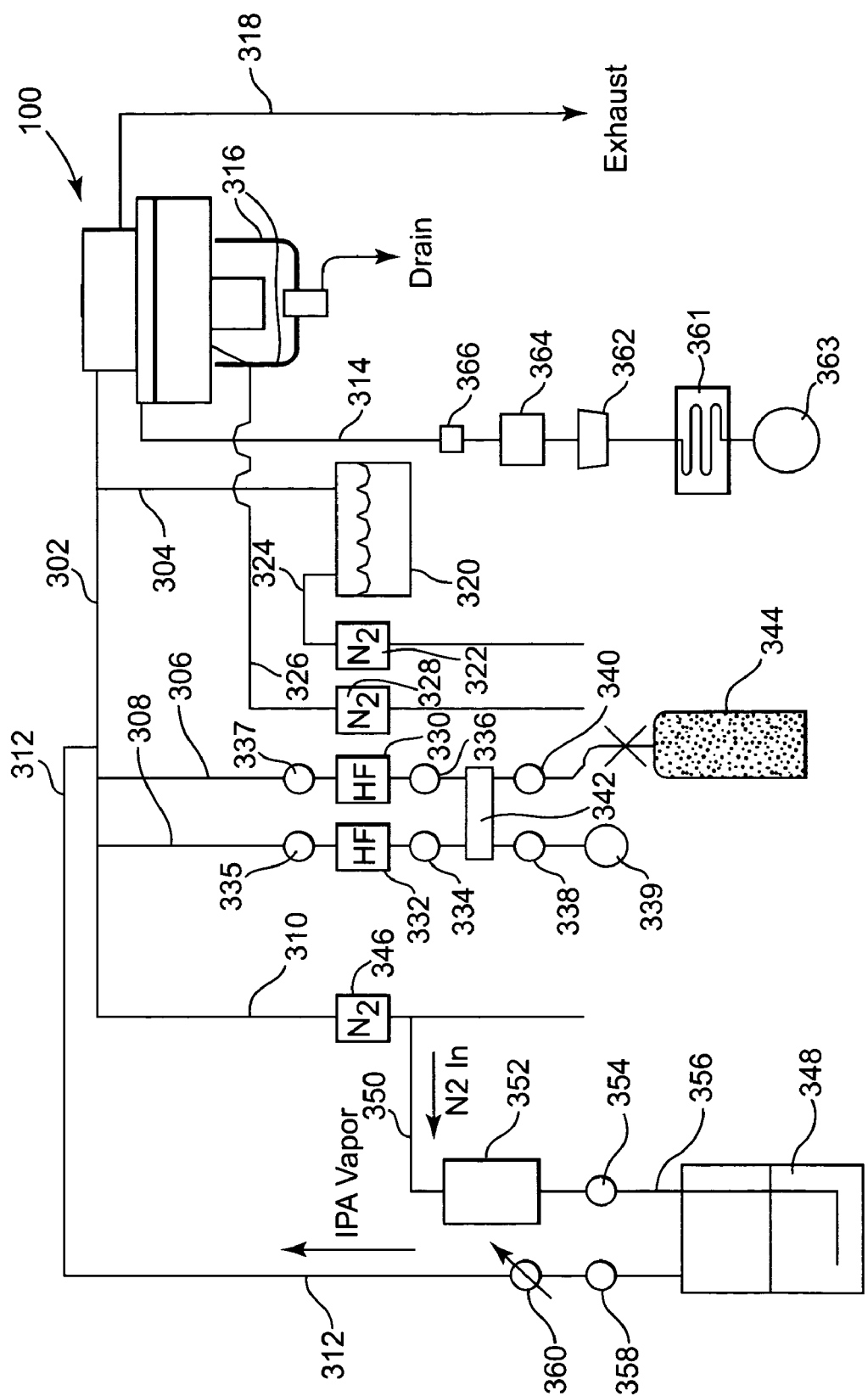
FIG. 2 is a schematic diagram of a microelectronic device processing system in accordance with the present invention including a processing chamber within which a microelectronic device can be rotated, rinsed and dried while controlling the delivery of rinse fluid and drying enhancement substance, and illustrates such a system also having the ability to perform processing steps including, in particular, an etching operation within a portion of the processing chamber with the controlled delivery of etching gas.
Figure 3:
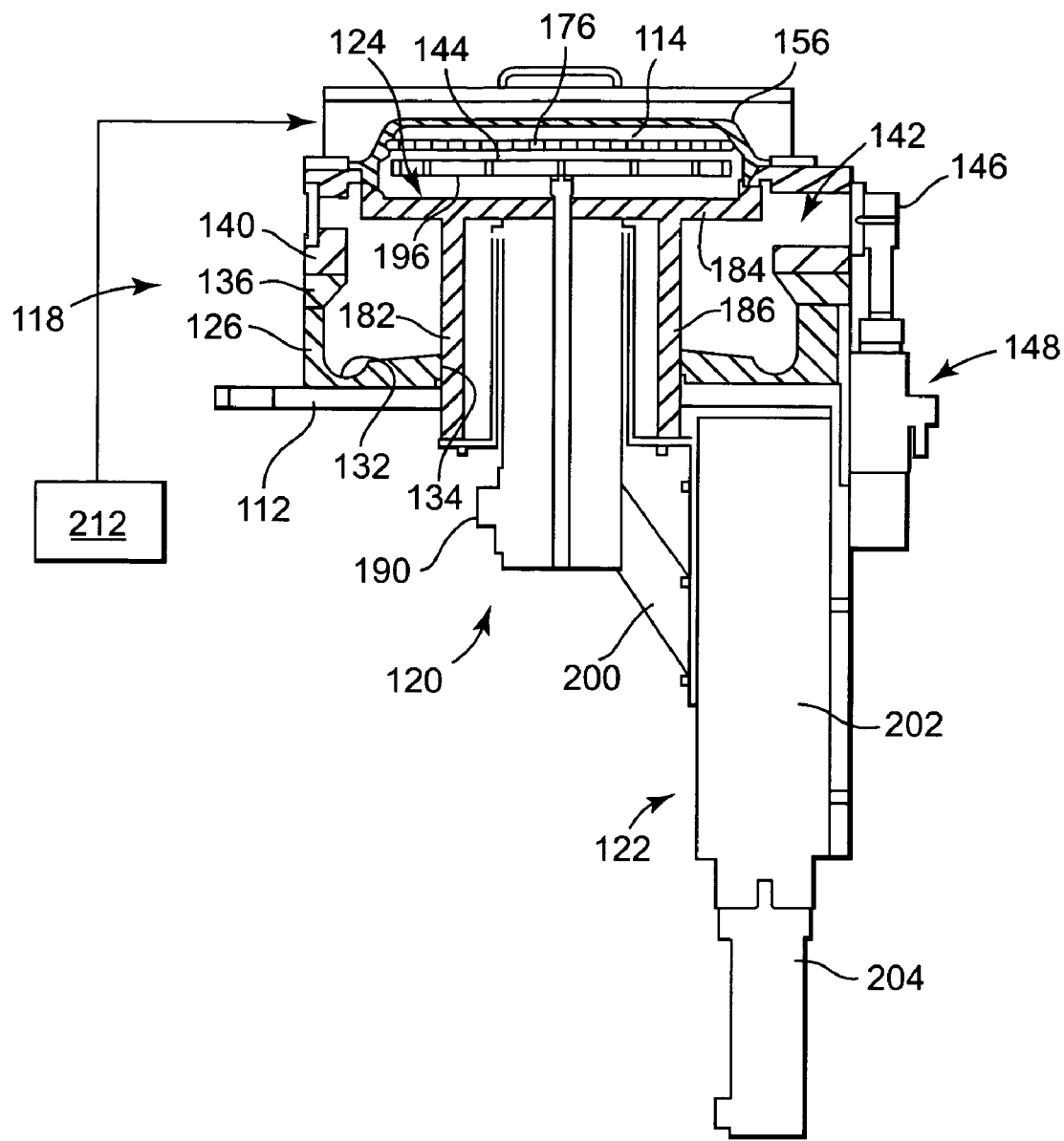
FIG. 3 is a side view partially in cross-section of a processing chamber that can be utilized in a system such as shown in FIG. 2 for providing both device rinsing and etching positions within the processing chamber, wherein the processing chamber is illustrated in an etching configuration.
Figure 4:
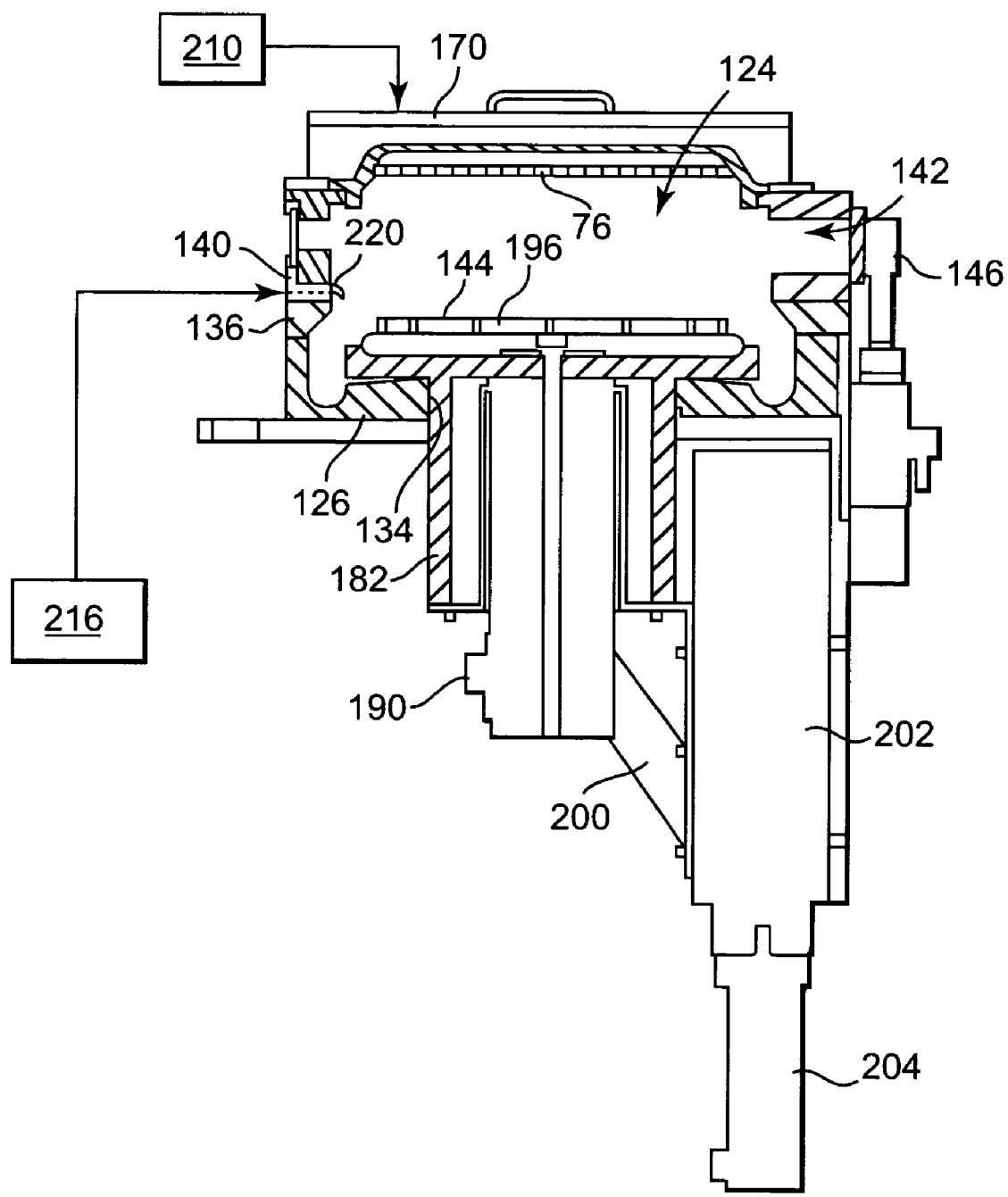
FIG. 4 is a side view partially in cross-section of the processing chamber of FIG. 3 with the processing chamber illustrated in a rinsing configuration.

In FIG. 2, a processing chamber 100 is schematically illustrated that may comprise any processing chamber within which one or more microelectronic devices can be rotatably supported, such as the chamber of FIG. 1 or any other described or suggested processing chamber, and having the ability to rinse a device and dry a device in accordance with the present invention. Moreover, FIG. 2 schematically shows a complete processing system including gas and fluid delivery aspects for etching, rinsing and drying microelectronic devices. FIGS. 3 and 4 illustrate a processing chamber that is similar in basic functionality as that schematically shown in FIG. 1, but being configurable between etching and rinsing configurations with only a single relative movement between the processing chamber components and the microelectronic device support components. Moreover, the etching configuration is defined with an etching chamber better isolated from the rinsing chamber, as shown in FIG. 3, to reduce etchant gas exposure within the lower rinsing chamber. This processing chamber is described in commonly owned U.S. Pat. No. 6,221,781, the entire disclosure of which is fully incorporated herein by reference.

A microelectronic device processing system chamber is illustrated that is mounted to a support structure 112. The support structure 112 may itself comprise any structure capable of supporting the wafer process system chamber in a desired position. Preferably the support structure 112 can position the wafer processing system chamber 100 so that a wafer can be supported substantially horizontally therein for spray processing including the ability to rotate the wafer during rinsing and/or drying.

The wafer processing system chamber is generally made up of functional components comprising a chamber-defining portion 118, a rotatable microelectronic device support section 120 and a drive mechanism 122. The rotatable support section 120 is operably connected to the drive mechanism 122 so that microelectronic device support and rotation components of the rotatable support section 120 can be movable between multiple positions inside of an internal process chamber 124 that is created by the chamber-defining portion 118.

As part of the chamber-defining portion 118, a rinse bowl 126 is positioned on and preferably fixed to a horizontal section of the support structure 112. The rinse bowl 126 defines a lower portion of the internal process chamber 124 in that it includes a bottom surrounded by a upwardly extending wall. A gutter 132 is preferably formed for collecting and channeling liquid (any process liquid that is applied, including rinse fluid) during processing and for leading such liquid to any number of drains (not shown) provided though the bottom. The bottom also includes an access opening 134 for slidably permitting movement of the rotatable microelectronic device support section 120.

A deflector ring 136 and a transfer ring 140 are preferably stacked on top of the rinse bowl 126 for extending the internal process chamber 124 and providing additional flow controls within the chamber. The transfer ring 140 includes at its front side a microelectronic device transfer slot 142 through which a microelectronic device 144 can be inserted or removed from within the internal process chamber 124. The transfer slot 142 should be suitable to accommodate the microelectronic device that is to be processed according to the desired application and to accommodate the transfer of the microelectronic device in or out of the internal process chamber 124 by a transfer robot. A transfer gate 146 is provided to be movable between opened and closed positions, preferably also including a gate drive mechanism 148 that is operatively mounted to the rinse bowl 126 to open and close the transfer gate 146, which mechanism 148 can include one or more pneumatic cylinders, although other mechanical, electrical, pneumatic and hydraulic devices can be used. The manner of controlling the extension and retraction of such drive cylinders can comprise any control system that can be designed in accordance with well know pneumatic system design criteria.

To close off the top of the internal process chamber 124, a top cover member 156, which is illustrated as a chamber bell, is fixed atop of an inner perimetric portion of the transfer ring 140. Appropriate sealing rings or gaskets are preferably located in between the top cover member 156 and the top surface of the transfer ring 140, the bottom surface of the transfer ring 140 and the top surface of the defector ring 136, and the bottom surface of the defector ring 136 and the top surface of the rinse bowl 126 as such sealing materials are conventionally known including perfluoro-elastomer seals. Seals are preferably provided so that the internal process chamber 124 can be substantially sealed from the outside environment when the wafer transfer gate 146 is closed.

A diffusion member 176 is also preferably mounted within the top cover member 156 by any conventional technique for the purpose of facilitating spreading of gas into the internal process chamber 124. Any number of gas inlet passages (not shown) may also be provided to pass through the top cover member 156 so as to provide one or more fluid passages that can be connected to gas supply lines for supplying gas into the internal process chamber 124, preferably at a point above the diffusion member 176.

The rotatable wafer support section 120, as shown, comprises a non-rotatable pedestal 182 having a base portion 184 and a slidable extension portion 186 that is preferably sized and shaped to be easily movable within the access opening 134 through the bottom of the rinse bowl 126. A rotary servo device, or spin motor 190 drives an output shaft to operatively support and provide rotary motion to a chuck 196 onto which a microelectronic device can be supported for rotary motion.

The drive mechanism 122 is operatively connected to the pedestal 182 by a bracket 200 that is also connected with the spin motor 190 that itself is non-rotationally connected with the pedestal 182. Preferably, the drive mechanism 122 comprises a linear drive device 202 that comprises a moving portion and a stationary portion. That is, the drive device 202 should be mountable by the portion thereof that is intended to be stationary while its moving portion is accessible to provide a driven output from the drive device 202. The stationary portion of the drive device 202 is thus preferably mounted to the support structure 112 and the movable portion of the drive device 202 is connected with the strut 200 so as to move the pedestal 182 and chuck 196. Preferably, the linear drive device 202 comprises a leadscrew and ball type slide device that is driven by another rotary servo or spin motor 204. Such leadscrew and ball slide mechanisms are well known in the art and are commercially available so that the movable slide portion of the linear drive device 202 moves linearly as a direct and measured result of the rotary movement of a shaft driven by the spin motor 204. The possible degree of linear movement is that defined by the entire range of movement of the particular linear drive device 202, although hard stops may limit the movement of the pedestal 182, such as where an upper portion of the pedestal 182 comes into contact with a surface of the top cover member 156 to define the etch position as shown in FIG. 3. The single linear drive device 202 can define any number of positions within the internal process chamber 124.

The components of the microelectronic device processing system chamber shown in FIGS. 3 and 4 or of the embodiment of FIG. 1 or otherwise can comprise known or developed materials that are particularly suitable for any particular application of the system chamber. That is, materials that are of sufficient strength, chemical resistance, and cleanliness may be desirable depending on the particular application. In the case of a semiconductor wafer processing system, the material of the components defining the chamber portion preferably comprise materials resistant to the etching gas and liquid solutions that are to be used. Moreover, all components are preferably made of materials suitable for use in a clean room environment. Suitable materials may include metals and plastics, of which it is preferable, for example in FIGS. 3 and 4, that the rinse bowl 126, deflector ring 136, transfer ring 140, top cover member 156, pedestal 182 and transfer gate 146 be comprised of PVDF plastic. Based upon the materials selected for the different components, any of the chamber components may be made integrally with other component parts, as desired. Specifically, since the top cover member 156 need not be separable from the rinse bowl 126, or the transfer ring 140 and/or the deflector ring 136, any and all of these components can be made integral with one another.

An etch position is illustrated in FIG. 3 where the pedestal 182 and chuck 196 are moved fully upward to a hard stop position where a surface of the pedestal 182 is positioned against the bottom surface of the top cover member 156. This position can be utilized for processing a microelectronic device as a vapor phase etch position where etching gas can be introduced from a supply 212 into the etch chamber portion that is defined between the base portion 184 of pedestal 182 and the top cover member 156 in the illustrated etch configuration of FIG. 3.

A rinsing position is illustrated in FIG. 4, which in the case of processing a microelectronic device, could take place before or after an etching step. The rinsing position is preferably defined by the pedestal 182 and the chuck 196 moved downward within the rinse bowl 126. Rinse fluid, such as DI water, is supplied from a supply 216 so as to be dispensed onto the surface of microelectronic device 144. A dispensing device 220, preferably comprising a PFA material tube of appropriate diameter can be located anywhere within the internal process chamber 124, such as by way of a passage provided through the transfer ring 140 as shown in FIG. 4, so long as it does not interfere with the other movements and as it is able to dispense the rinse fluid onto the microelectronic device surface. As discussed above, during the rinsing step, drying enhancement substance, such as IPA, is preferably delivered along with a carrier gas, such as clean nitrogen, from a supply 210 (which may actually comprise any number of supply sources, as discussed more below) to purge the chamber 124 and importantly to deliver the drying enhancement substance to the surface of the microelectronic device for enhanced rinsing and drying. The rinsing operation also preferably takes place while the chuck 196 is rotatably driven by its spin motor 190.

Preferably, the drying step is also conducted while the microelectronic device is maintained in the rinsing configuration, although the chuck 196 could be repositioned to another drying position. Drying gas can be delivered as well as schematically illustrated from the supply 210 or any number of other sources and preferably comprises a heated dry nitrogen gas. Drying enhancement substance may also be delivered within the drying gas or separately delivered with or without a carrier gas from another source.

When the operations to be performed are complete, the pedestal 182, chuck 196 and thus microelectronic device 144 can then be repositioned in the transfer position. Then, the transfer gate 146 can be opened to provide access to a robot end effector to remove the microelectronic device 144. Any number of process steps can be conducted within the internal process chamber 124. Moreover, any of the processing chambers discussed or suggested above accommodate the ability to create and subsequently rinse an HF last-etched silicon wafer that, if etched sufficiently to remove the native oxides, will render a silicon surface hydrophobic for the rinse operation. The present invention is particularly applicable to rinsing such HF last-etched silicon surfaces for better particle removal, but equally applicable to other hydrophobic surfaces as well as to hydrophilic surfaces or partially hydrophilic surfaces.

A processing chamber usable in accordance with the process controls of the present invention can be any of those described or suggested above or any other design that at least provides a processing chamber within which a microelectronic device can be supported and preferably rotated during a rinsing step. Also, so long as the delivery of drying enhancement substance, preferably in gas form or alternatively as atomized liquid droplets within a gas carrier, is facilitated along with the delivery of a rinse fluid, any processing chamber can be utilized regardless of whether such processing chamber also facilitates etching or any other processing step. Preferably, the delivery of drying gas is also accommodated in any processing chamber for use in accordance with the present invention, more preferably along with the supply of drying enhancement substance as above.

Referring back to FIG. 2, one system in accordance with present invention for delivering processing fluids to a microelectronic device processing chamber 100 is schematically illustrated, which particular system includes the ability to conduct device processing such as etching along with rinsing and drying. It is understood that FIG. 2 shows one possible flow diagram to provide rinse fluid, such as DI water, and gas (including for etching, purging, delivering drying enhancement substance, and drying) to a processing chamber in accordance with the present invention. In particular, FIG. 2 shows a fluid diagram including the delivery of etching gas, clean gas and vapor for purging the chamber, clean carrier gas to deliver drying enhancement substance, and clean gas for drying. The processing chamber 100 is also shown as having adequate gas exhaust and liquid drainage. For any particular application in accordance with the present invention, only the rinse fluid supply and delivery of drying enhancement substance to a processing chamber are needed. Preferably, drying gas is also delivered to the processing chamber. For creating HF last-etched silicon microelectronic devices, it is preferable to conduct the rinsing and etching within the same process chamber (or portions thereof). Otherwise, more or less fluid systems can be included to a processing chamber for any particular application.

Processing chamber 100 is illustrated connected with a gas supply line 302 that opens into the processing chamber, preferably at an upper portion thereof, and is connected with a number of gas supply lines including a vapor supply line 304, a first etchant supply line 306, a second etchant supply line 308, a clean inert gas supply line 310 and a drying enhancement substance supply line 312. The processing chamber 100 is also connected with a rinse fluid supply line 314 that also opens into the processing chamber, preferably at a point suitable for rinsing a microelectronic device as supported therein. Drain lines 316 open from the processing chamber 100 for liquid removal, such as rinse fluid, and exhaust line 318 opens from the processing chamber for allowing gas to exhaust. Any number of such drain and exhaust lines, vents or the like can be provided as desired.

Vapor supply line 304 further connects with a vapor vessel 320 that holds a quantity of liquid, preferably DI water, and through which a carrier gas, such a nitrogen is supplied from a source 322 connected to the vessel 320 by a line 324. Nitrogen is preferably used to carry water vapor into the processing chamber 100 as part of an etch process for initiating and sustaining such an etch.

A further supply line 326 is also illustrated as connecting a source 328 of gas, preferably clean nitrogen, into a portion of the processing chamber 100 for purging a chamber surrounding the spin motor to keep etching gas from attacking it, as such purge gas is preferably provided independently of the gas(es) as may be provided via line 302 and as discussed further below.

Etchant delivery can be selectively facilitated by way of one or both of lines 306 and 308. Mass flow controllers 330 and 332 are provided for controlling flow rates into lines 306 and 308. Valves 334, 335, 336, 337, 338 and 340 are also illustrated for selectively permitting fluid flow. A nitrogen block 342 is also shown for selectively connecting lines 306 and 308 before the purging the mass flow controllers 330 and 332 and to permit nitrogen from source 339 to purge the mass flow controllers 330 and 332 during periodic maintenance. Preferably, an etchant such as an acid is provided to remove oxides from the surface of a substrate. Such an acid can be delivered to lines 306 and 308 via nitrogen block 342 as supplied by a vessel 344. Preferably, the acid, such as anhydrous HF, is provided as a liquid source from which gas is boiled off in a controlled manner, as is well known. FIG. 2 shows a vapor etch system as an example; however, a liquid etch system could instead be utilized (not shown). The specifics of any vapor or liquid etch steps may vary, but the foregoing and following exemplary materials and conditions may be useful. Liquid etching can generally involve applying to a surface of a microelectronic device a solution of an etching agent (e.g., an acid) that can remove oxides from the surface. Exemplary acid etching agents delivered either as vapor or liquid include hydrofluoric acid (HF), e.g., aqueous HF at any useful concentration, for example up to about 49% aqueous HF, optionally buffered (buffered hydrofluoric acid, (BHF) (also referred to as Buffered Oxide Etching agent or BOE).

Gas supply line 310 connects a mass flow controller 346 operatively connected with a source (not shown) of preferably clean inert gas, such as nitrogen, to gas supply line 302 for ultimate delivery into the processing chamber 100 for any number of reasons. Also, prior to the mass flow controller 346, the same inert gas source is operatively connected to clean inert gas to a bubbler vessel 348 by way of line 350, another mass flow controller 352, and on/off valve 354. From the control valve 354, line 356 extends into the bubbler vessel 348 sufficiently so that a quantity of drying enhancement substance maintained within the vessel 348 covers a section of line 356 (such as a tube and/or sparger) having any number of openings (not shown) through which the gas can exit line 356 to bubble up through the drying enhancement substance and thus pick up gaseous drying enhancement substance to accumulate within a headspace volume in the vessel 348. The design and operation of such bubblers are well known and conventional and any such design capable of providing a concentration of drying enhancement substance in accordance with the present invention can be used. Drying enhancement substance can thus be preferably supplied to line 312, and ultimately to line 302, via a control valve 358 and a back pressure regulator 360 in order to deliver drying enhancement substance to the processing vessel at a desired concentration and pressure. As discussed above, the drying enhancement substance preferably comprises any known or developed tensioactive compound that may be delivered in a preferred concentration range as a vapor, i.e. a gas dissolved within another gas, or as liquid droplets suspended within another gas. Preferably, the tensioactive compound comprises isopropyl alcohol (IPA) that is delivered in a concentration range of less than 3.6% due to flammability concerns, although greater concentrations are certainly usable with appropriate safety measures or for other specific applications.

Delivery control components, such as the mass flow controller 352, the back pressure regulator 360 and vessel environmental controls (temperature, volume, pressure, not shown) are utilized in controlling the specific delivery of the drying enhancement substance to the processing chamber at the desired concentration, pressure and temperature. Tensioactive compounds include, in particular, those that affect surface tension and create a surface tension gradient within liquid on a microelectronic device surface, as such are known and include isopropyl alcohol (IPA), 1-methoxy-2-propanol, di-acetone alcohol, and ethyleneglycol. Delivery of controlled gas, such as clean nitrogen, from a source (not shown) can be facilitated by any conventional supply regulator (not shown) and the mass flow controller regulator 352 to define a suitable gas flow as measured in standard liters per minute (SLM) and as permitted to flow into the vessel 348 via valve 354. Other suitable gases than nitrogen are contemplated, although a non reactive gas is preferred in that will not react with the tensioactive compound or the microelectronic device within the processing chamber 100. Furthermore, each of the control components noted herein are further preferably operatively connected with a control system (not shown) as comprising electronic control circuitry and appropriate servo devices for operatively opening and closing a desired source of process liquids and/or gases at an appropriate time and for a desired period. For example, as described above and discussed in more detail below, drying enhancement substance is preferably delivered within a desired concentration range and flow via line 302 into the processing chamber 100 during the delivery of rinse liquid via line 314 onto a surface of a microelectronic device within the processing chamber 100. Delivery of drying enhancement substance is also preferred during at least some of the drying step as well, which drying gas also preferably comprises an inert gas (that may be heated or not) at a desired flow rate as may be delivered via the line 302 and 312. Whereas, the specific components and circuits of any such automated or manual control system, including the use of computers and other data processing devices, is not important to the functionality of the present invention and such system components are themselves well known, no further discussion is provided. The functionality of systems of the present invention can be developed in accordance with well know design parameters and rules for controlling fluid flow at coordinated timing and delivery periods. Such a control system also preferably is operatively connected with the timing and speeds of rotation of a supporting turntable within the processing chamber as such can support a microelectronic device thereon, such as by connection with the spin motor that is operatively connected with a turntable as exemplified in the processing chamber embodiments described above.

As mentioned above, other processing chambers are contemplated as usable in accordance with the present invention. Specifically, any processing chamber that includes the ability to support a microelectronic device and to deliver rinse fluid and drying enhancement substance is usable. Preferably, the microelectronic device should be supported to be controllably rotated as part of a drying process. Other specific examples of suitable apparatuses are described within the following identified two copending provisional U.S. patent applications that are filed on the same date as this application and the disclosures of which are fully incorporated herein by reference, the first of which is further identified by attorney docket no. FSI0165/P1, naming Steven Hanson as one of the inventors and entitled COMPACT DUCT SYSTEM INCORPORATING MOVEABLE AND NESTABLE BAFFLES FOR USE IN TOOLS USED TO PROCESS MICROELECTRONIC WORKPIECES WITH ONE OR MORE TREATMENT FLUIDS, and the second of which is further identified by attorney docket no. FSI0166/P1, naming Alan Rose as one of the inventors and entitled COMPACT DUCT SYSTEM INCORPORATING MOVEABLE AND NESTABLE BAFFLES FOR USE IN TOOLS USED TO PROCESS MICROELECTRONIC WORKPIECES WITH ONE OR MORE TREATMENT FLUIDS.

An aspect of the present invention is the provision of the rinse fluid, preferably DI water, at a desired temperature range. DI water can be chilled by any conventional or developed heat exchanger 361, preferably providing a controllable consistent water temperature, that is preferably operatively provided between to a particle filter 362 and a D1 water supply source 363, each shown in rinse fluid supply line 314. More preferably, the rinse fluid is filtered by the particle filter 362 to remove particles greater than 0.1 microns. A flow control needle value 364 is illustrated after the filer 362 for controlling rinse fluid flow rate. A control valve 366 is also shown within rinse fluid supply line 314 for turning the rinse fluid flow on and off.

The environmental conditions within the processing chamber 100 are preferably controlled during at least a final portion of a rinse operation so that delivery of the drying enhancement substance at a desired concentration will permit the drying enhancement substance to be present at the desired concentration within the processing chamber 100. Preferably, the only gases flowing into the processing chamber at the stage of delivery of drying enhancement substance comprise these gases that define the desired concentration of the drying enhancement substance. For example, using nitrogen gas mixed with IPA at a desired concentration, the mixture could be delivered using the nitrogen as a carrier gas mixed with IPA at the desired concentration or each could be delivered supplementally to one another. Drying enhancement substance is more preferably provided at a concentration within a gas environment of the processing chamber below its saturation level for a controlled environmental processing temperature (so it won't condense out). As examples, the dew point for a 3.2% IPA concentration is around room temperature (about 25° C.) and the dew point for a 1% IPA concentration is around 0° C. However, the drying enhancement substance concentration is preferably sufficiently close to the saturation point so that a localized condensation can controllably occur at a microelectronic device surface as such surface is cooled by rinse fluid provided at a temperature below the dew point of the drying enhancement substance within the processing chamber. By providing the drying enhancement substance as vapor at least during a final portion of the rinse step ensures the controllability of being able to use the rinse fluid to cool the device surface to cause a localized condensation. For a given concentration of drying enhancement substance within the chamber, its dew point is a known temperature. Also, for given environmental conditions within the chamber including temperature and pressure, the environmental gas will hold a known quantity of drying enhancement substance vapor up to its saturation point before it condenses out of the gas environment. The temperature below the environmental temperatures is its dew point. Thus, it is preferable to deliver the rinse fluid at a temperature that is below the dew point of the drying enhancement substance within the process chamber under the current environment conditions. Chilling the rinse fluid to below the dew point of the drying enhancement substance within the process chamber has the effect to lower the temperature of the microelectronic device surface and a local environment adjacent the device surface to cause some amount of the drying enhancement substance to condense on the surface of the microelectronic device. Such condensed drying enhancement substance has been found to improve the removal of the rinse fluid from the surface with a corresponding reduction in contamination such as water marks and the presence of small particles after drying.

The table illustrated in FIG. 5 shows the results of a number of process examples conducted with DI water as the rinse fluid at temperatures between 10° C. and 21° C. The data of the FIG. 5 table was obtained by experiments conducted on hydrophobic HF last-etched 200 mm silicon wafers as they result after an etching process substantially removing all native oxide.

In this table, a temperature of 15° C. is considered close but slightly above the dew point of IPA as provided at a concentration of 3% within the processing chamber. The data shows that by providing the DI water at a temperature below this dew point, such as at 10° C., the post treatment presence of light point defects greater than or equal to 65 nanometers was reduced for hydrophobic wafers by an order of magnitude as compared to results above the dew point at 21° C. and 15° C. Such reduction in particles being found regardless of whether the IPA was delivered only during the drying step or both during the rinsing and drying steps and at different rotational speeds during the drying step. However, at the slower rotational speed of 500 rpms during the dry step, even better results were obtained, which results are believed to be due to a reduction in backsplash of the DI water at slower speeds.

Where it is indicated that the IPA was delivered during the rinse and dry steps, IPA was supplied at the noted concentration throughout both steps. Where it is indicated that the IPA was delivered only during the drying step, the commencement of the supply of IPA at the noted concentration was just prior to a transition of the process steps from the rinse step to the dry step. As such, the data in the table of FIG. 5 also suggests that substantially the same effect can be attained by providing the IPA at or just before the transition from rinsing to drying as when the IPA is provided also during the entire rinse step. That is, the benefit of the IPA in particle reduction post rinsing and drying is realized even if the IPA is introduced only at a time proximate to the transition from rinsing to drying. In other words, the effect of the cool rinsing fluid on the wafer surface to cause localized IPA condensation is realized even if the IPA is delivered only at the transition stage from the rinse to dry steps. A reduction in the demand for IPA can thus also be beneficially achieved.

As a general trend, the data of the table of FIG. 5 also shows that increasing the IPA concentration from 1% to 3% (or higher if conditions permit) had the effect of increasing the effectiveness of the IPA in better particle reduction for hydrophobic wafers. Whereas it is believed beneficial to condense the IPA onto the wafer surface, such as caused by providing the DI water at a temperature below the IPA dew point based upon the environmental conditions in the processing chamber, it follows that a higher IPA concentration from 1% to 3% would permit the IPA to condense onto the wafer surface at a given temperature, such as the temperature of the wafer surface as affected by the cooler rinse D1 water. As noted above, the dew point for a 3.2% IPA is around room temperature.

FIG. 5 shows in the "Pre," "Post" and "Delta" columns the measured light point defect counts of defects (e.g. particles) greater than or equal to 65 nanometers on 200 mm wafers as were determined using a KLA Tencor SP1 TBI type device. Such a device is commercially available from KLA Tencor of San Jose, Calif.

A manner of determining the effectiveness of a rinsing and drying process on hydrophilic microelectronic devices is to measure the film thickness of rinse fluid that is left on the microelectronic device surface after rinsing and drying. The importance of the thickness is that the remaining liquid film will eventually evaporate from the microelectronic device surface. Moreover, the greater the thickness of the liquid film that remains, the greater is the expectation of an increase in contaminants on the microelectronic device surface after evaporation. An accepted method of determining film thickness of DI water on a wafer surface is to introduce potassium chloride (KCl) with the rinse fluid. In particular, the controlled introduction of a known concentration of KCl with rinse D1 water allows the post-processing rinse liquid thickness to be determined. Such determination can be made based upon data collected via total reflection x-ray fluorescence TXRF), as such is well known as described in U.S. Pat. No. 6,568,408 to Mertens et al. Data obtained by using the KCl measurement method on a number of hydrophilic wafers after rinsing and drying is shown in the table of FIG. 6 as such rinsing and drying was conducted as noted but otherwise similar to that described above with respect to the FIG. 5 data. The table of FIG. 6 also includes comparative data derived from a liquid bath method in the manner of lifting wafers from a DI water bath with and without being subjected to IPA as described in assignee's U.S. Pat. Nos. 5,542,441, 5,651,379 and 6,312,597 to Mohindra et al. The data of the table of FIG. 6 is consistent with that of the table of FIG. 5 as to the use and benefits of using cooler DI water temperature at select rotational speeds and at different IPA durations and concentrations. Such data also shows that the evaporated thickness is reduced with the use of cooler rinse fluid to the order obtained by the comparative bath methods with IPA.

The processing controls of the present invention, in particular the use of cooler rinse fluid, are seen to be beneficial to rinsing and drying of microelectronic devices that are either hydrophobic or hydrophilic. With hydrophilic substrates, results are obtained in the level of that seen with Marangoni bath methods. For hydrophobic wafers, a significant reduction in small particle presence is obtained. The present invention improves the rinsing and during of microelectronic devices in a spin processing system regardless of the hydrophobic or hydrophilic nature of the device surface(s), but provides a dramatic improvement in particle reduction on such devices including hydrophobic surface(s).

The invention claimed is:

1. A method of processing a microelectronic device comprising the steps of:
   supporting a microelectronic device on a support that is operatively provided within a processing chamber;
   rinsing the microelectronic device by dispensing rinsing fluid onto a surface of the microelectronic device within the processing chamber;
   delivering drying enhancement substance into a gas environment within the processing chamber during at least a portion of the rinsing step and for a time period after the dispensing of rinsing fluid is terminated for drying the microelectronic device so that the drying enhancement substance is present at a desired concentration within the gas environment of the processing chamber below its saturation point to thereby set a dew point for the drying enhancement substance; and
   controlling the temperature of the rinse fluid as dispensed during at least a final portion of the rinsing step to be below the dew point of the drying enhancement substance within the processing chamber for cooling the surface of the microelectronic device during at least the final portion of the rinsing step to a temperature that causes a local cooling of the gas environment so that drying enhancement substance condenses to the surface of the microelectronic device.

2. The method of claim 1, wherein the drying enhancement substance is delivered to achieve a concentration of between 1% and 3.6% by volume within the processing chamber.

3. The method of claim 2, wherein the drying enhancement substance is delivered at a concentration of between 1% and 3.6% by volume to the processing chamber.

4. The method of claim 2, wherein the drying enhancement substance comprises tensioactive compound that is mixed with gas that is non-reactive to the microelectronic device and the tensioactive compound to create the desired concentration of drying enhancement substance within the processing chamber.

5. The method of claim 4, wherein the rinse fluid is chilled to a temperature below the dew point of the drying enhancement substance so that the rinse fluid cools the surface of the microelectronic device to below the dew point of the drying enhancement substance to cause a localized condensation of drying enhancement substance onto the surface of the microelectronic device from an adjacent environment of the gas environment.

6. The method of claim 5, wherein the rinse fluid is chilled to below 15° C. for dispensing during the rinsing step.

7. The method of claim 5, wherein the rinse fluid is chilled to 10° C. or below for dispensing during the rinsing step.

8. The method of claim 5, wherein the drying enhancement substance is delivered at a timing proximate to a transition from the rinsing step to the drying step.

9. The method of claim 8, wherein the drying enhancement substance is delivered throughout the drying step, which drying step further comprises rotating the microelectronic device at a rotational speed between 300 and 3000 rpm for enhancing removal of rinse fluid from the surface of the microelectronic device.

10. A method of processing a microelectronic device comprising the steps of:
    supporting a microelectronic device on a rotatable support that is operatively provided within a processing chamber;
    rinsing the microelectronic device by dispensing rinsing fluid onto a surface of the microelectronic device while rotating the microelectronic device within the processing chamber;
    drying the microelectronic device by rotating the microelectronic device after the dispensing of rinsing fluid is terminated within a gas environment;
    delivering drying enhancement substance into the gas environment within the processing chamber during at least a portion of the rinsing step and for a time period of the drying step so that the drying enhancement substance is present at a desired concentration within the gas environment of the processing chamber below its saturation point to thereby set a dew point for the drying enhancement substance; and
    controlling the temperature of the rinse fluid as dispensed during at least a final portion of the rinsing step to be below the dew point of the drying enhancement substance within the processing chamber for cooling the surface of the microelectronic device during at least the final portion of the rinsing step to a temperature that causes a local cooling of the gas environment so that drying enhancement substance condenses to the surface of the microelectronic device.

11. The method of claim 10, wherein the drying enhancement substance is delivered to achieve a concentration of between 1% and 3.6% by volume within the processing chamber.

12. The method of claim 11, wherein the drying enhancement substance is delivered at a concentration of between 1% and 3.6% by volume to the processing chamber.

13. The method of claim 11, wherein the drying enhancement substance comprises tensioactive compound that is mixed with gas that is non-reactive to the microelectronic device and the tensioactive compound to create the desired concentration of drying enhancement substance within the processing chamber.

14. The method of claim 13, wherein the rinse fluid is chilled to a temperature below the dew point of the drying enhancement substance so that the rinse fluid cools the surface of the microelectronic device to below the dew point of the drying enhancement substance to cause a localized condensation of drying enhancement substance onto the surface of the microelectronic device from an adjacent environment of the gas environment.

15. The method of claim 14, wherein the rinse fluid is chilled to below 15° C. for dispensing during the rinsing step.

16. The method of claim 14, wherein the rinse fluid is chilled to 10° C. or below for dispensing during the rinsing step.

17. The method of claim 14, wherein the drying enhancement substance is delivered at a timing proximate to a transition from the rinsing step to the drying step.

18. The method of claim 17, wherein the drying enhancement substance is delivered throughout the drying step, which drying step further comprises rotating the microelectronic device at a rotational speed between 300 and 3000 rpm.

* * * * *

UNITED STATES PATENT AND TRADEMARK OFFICE
CERTIFICATE OF CORRECTION

| | | |
|---|---|---|
| PATENT NO. | : 8,070,884 B2 | Page 1 of 1 |
| APPLICATION NO. | : 11/096935 | |
| DATED | : December 6, 2011 | |
| INVENTOR(S) | : Gast | |

It is certified that error appears in the above-identified patent and that said Letters Patent is hereby corrected as shown below:

Title Page,
Item (54) Title, and Col. 1, Line 4 please delete "ENVIROMENT" and insert in place thereof, --ENVIRONMENT--.

Signed and Sealed this
Twenty-first Day of February, 2012

David J. Kappos
*Director of the United States Patent and Trademark Office*